(12) United States Patent
Miyanaga et al.

(10) Patent No.: US 7,902,891 B1
(45) Date of Patent: Mar. 8, 2011

(54) TWO POINT MODULATOR USING VOLTAGE CONTROL OSCILLATOR AND CALIBRATION PROCESSING METHOD

(75) Inventors: Kenji Miyanaga, Osaka (JP); Akira Kato, Osaka (JP); Paul Cheng-Po Liang, Santa Clara, CA (US); Thomas Biedka, San Jose, CA (US)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/576,953

(22) Filed: Oct. 9, 2009

(51) Int. Cl.
*H03L 7/06* (2006.01)
(52) U.S. Cl. .......................... 327/158; 327/149
(58) Field of Classification Search .................. 327/149, 327/158
See application file for complete search history.

(56) References Cited

U.S. PATENT DOCUMENTS

| | | | |
|---|---|---|---|
| 5,834,987 A * | 11/1998 | Dent ............................. | 332/127 |
| 6,844,763 B1 * | 1/2005 | Balboni ........................ | 327/159 |
| 6,967,513 B1 * | 11/2005 | Balboni ........................ | 327/157 |
| 7,012,471 B2 * | 3/2006 | Lyden et al. ..................... | 331/16 |
| 7,015,738 B1 * | 3/2006 | Cao ................................. | 327/159 |
| 7,061,341 B1 | 6/2006 | Groe | |
| 7,142,063 B2 * | 11/2006 | Grewing et al. ................ | 331/16 |
| 7,154,347 B2 * | 12/2006 | Grewing et al. ................ | 331/23 |
| 7,430,265 B2 * | 9/2008 | Convent et al. ................ | 375/376 |
| 7,436,227 B2 * | 10/2008 | Thomsen et al. ............. | 327/147 |
| 7,502,435 B2 * | 3/2009 | Hammes ........................ | 375/376 |
| 7,579,922 B2 * | 8/2009 | Jensen et al. .................... | 332/128 |
| 7,714,666 B2 * | 5/2010 | Ke et al. ............................ | 331/16 |
| 7,755,439 B2 * | 7/2010 | Yu et al. ............................ | 331/23 |
| 7,760,042 B2 * | 7/2010 | Mayer et al. ................... | 332/128 |
| 2006/0197605 A1 * | 9/2006 | Hirano et al. .................... | 331/16 |
| 2007/0188243 A1 * | 8/2007 | Waheed et al. .................. | 331/16 |
| 2008/0007346 A1 * | 1/2008 | Jensen et al. ..................... | 331/16 |
| 2008/0007365 A1 * | 1/2008 | Venuti et al. ................... | 331/179 |
| 2009/0002079 A1 * | 1/2009 | Venuti et al. ..................... | 331/10 |
| 2009/0256601 A1 * | 10/2009 | Zhang et al. ................... | 327/156 |
| 2010/0271089 A1 * | 10/2010 | Plevridis et al. ............... | 327/157 |
| 2010/0272222 A1 * | 10/2010 | Mitani et al. ................... | 375/376 |
| 2010/0277211 A1 * | 11/2010 | Geng et al. ..................... | 327/158 |

* cited by examiner

*Primary Examiner* — Lincoln Donovan
*Assistant Examiner* — Adam D Houston

(57) ABSTRACT

A two-point modulator using a voltage control oscillator includes: a modulation section including a feedback circuit for performing feedback control of a signal outputted from the voltage control oscillator based on an inputted modulated signal, and a feedforward circuit for calibrating the modulated signal and outputting the calibrated modulated signal to the voltage control oscillator; a signal output section for, upon calibration processing, outputting a predetermined reference signal in place of the modulated signal, to the modulation section; and a gain correction section for, in a state where the feedback circuit is in an open loop state, calculating a frequency transition amount of the reference signal outputted from the voltage control oscillator, and correcting a gain used for calibration of the modulated signal performed by the feedforward circuit, based on the calculated frequency transition amount.

14 Claims, 16 Drawing Sheets

FIG. 6

| CHANNEL FREQUENCY f | CORRECTION GAIN VALUE G |
|---|---|
| fa | Ga |
| fb | Gb |
| fc | Gc |
| ... | ... |

FIG. 12

| CHANNEL FREQUENCY f | CORRECTION GAIN VALUE $G_N$ | | | | | | | | |
|---|---|---|---|---|---|---|---|---|---|
| | -A1 | +A1 | -A2 | +A2 | -A3 | +A3 | -A4 | +A4 | |
| fa | Ga2 | Ga3 | Ga4 | Ga5 | Ga6 | Ga7 | Ga8 | Ga9 | |
| fb | Gb2 | Gb3 | Gb4 | Gb5 | Gb6 | Gb7 | Gb8 | Gb9 | |
| fc | Gc2 | Gc3 | Gc4 | Gc5 | Gc6 | Gc7 | Gc8 | Gc9 | |
| ... | | | | | ... | | | | |

US 7,902,891 B1

TWO POINT MODULATOR USING VOLTAGE CONTROL OSCILLATOR AND CALIBRATION PROCESSING METHOD

BACKGROUND OF THE INVENTION

1. Field of the Invention

The present invention relates to a two point modulator using a voltage control oscillator and a calibration processing method, and more particularly, to a two-point modulator calibrating a gain and nonlinearity of a voltage control oscillator, and a calibration processing method performed by the two-point modulator.

2. Description of the Background Art

As generally known, a voltage control oscillator (hereinafter, referred to as VCO) is widely used, as a device for generating a local oscillation signal, for a modulator of a radio communication apparatus. By using the VCO, a frequency modulated signal or a phase-modulated signal can be generated. Moreover, by inputting a modulated signal having a constant envelope, generated by the VCO, to a power amplifier, and controlling a supply voltage of the power amplifier, a modulated signal having a modulated component also on its amplitude can be generated (phase shift keying; PSK, code division multiple access; CDMA, orthogonal frequency division multiplexing; OFDM, etc.). In recent years, there arises a need for enabling an oscillation frequency of the VCO to be adjusted over a wide range of frequencies, in order to adapt the modulator to a communication system using a plurality of different frequency bands.

With that, in order to realize a modulator having a wide band, there is suggested a modulation method called two-point modulation. FIG. 13 shows an example of a configuration of a modulator using a conventional two-point modulation method.

As shown in FIG. 13, the conventional two-point modulator 501 includes an operation section 521, a frequency error calculation section 522, a loop filter 523, a adding section 525, a VCO 526, a frequency detection section 527, and a buffer 528.

A modulated signal is converted to a signal corresponding to a desired frequency channel by the operation section 521, and outputted as a low-pass response signal via a frequency error calculation section 522 and a loop filter 523. Meanwhile, a modulated signal is adjusted by the buffer 528 so as to be a desired signal, and then outputted as a high-pass response signal. The adding section 525 adds the high-pass response signal to the low-pass response signal, and inputs the resultant signal to the VCO 526. A signal outputted from the VCO 526 is fed back and inputted to the frequency error calculation section 522 via the frequency detection section 527. The frequency error calculation section 522 detects and outputs a frequency error between the modulated signal outputted from the operation section 521 and the signal outputted from the frequency detection section 527. This feedback processing stabilizes a frequency of the signal outputted from the VCO 526.

Thus, by using two-point modulation method, modulation characteristics including in a combined manner a frequency gain as a low-pass response via a feedback circuit and a frequency gain as a high-pass response via a feedforward circuit can be obtained, whereby a modulator having a wide band can be realized (FIG. 14).

However, even by using the above two-point modulation method, there remains a problem that, if the VCO 526 is a VCO exhibiting nonlinearity, a frequency band in which linear modulation can be performed is narrow, distortion occurs on the output, and, as a result, wideband frequency characteristics cannot be obtained (FIG. 15). Therefore, there arises a need for calibrating a gain and/or nonlinearity of the VCO 526.

U.S. Pat. No. 7,061,341 (Patent Document 1) discloses an invention for solving the above problem. FIG. 16 shows an example of a configuration of a conventional direct modulator 511 disclosed in Patent Document 1.

As shown in FIG. 16, the conventional direct modulator 511 includes a PLL circuit having a VCO 1506, a divide-by-N frequency divider (N counter) 1508, a phase comparator, a charge pump (CP), and an RC connection filter. A phase signal corresponding to a desired channel is converted to a digital modulated signal by $\Delta\Sigma$ modulator, and the digital modulated signal is supplied to the divide-by-N frequency divider 1508 and the phase comparator. A step signal $\Delta f_{PM}$ is converted to an analog signal by a D/A converter 1510, and is inputted to an auxiliary terminal 1504 of a VCO 1506 via a low-pass filter (hereinafter, referred to as LPF) 1512.

In the above configuration, the PLL circuit is operated in a closed loop state. First, a desired channel frequency fc is inputted and the VCO 1506 is locked up at a division ratio N. A lockup voltage $V_{ctrl}$ used upon the lockup is held [$f_{REF}=f_C/N$]. Next, the step signal $\Delta f_{PM}$ is inputted and the division ratio of the divide-by-N frequency divider 1508 is shifted by $\Delta N$. Moreover, the step signal $\Delta f_{PM}$ is adjusted such that the lockup voltage $V_{ctrl}$ used at this time is the same as the lockup voltage initially used [$f_{REF}=(f_C+\Delta f_{PM})/(N+\Delta N)$]. By performing the above processing for a plurality of calibration points, the conventional direct modulator 511 calibrates a gain or nonlinearity of the VCO 1506.

However, in the conventional direct modulator 511 disclosed in Patent Document 1, since the PLL circuit is operated in a closed loop state, it takes a long time to perform calibration processing on the VCO 1506. Therefore, in a communication system in which there is a restriction on lockup time due to the specification thereof, it can occur that the lockup is not completed in time. If calibration processing is started in a state where the lockup is not sufficiently performed (is not completed), frequency offset occurs.

In addition, during calibration processing, there is also a problem that the lockup voltage varies by leakage in a filter or a parasitic capacitance included in the apparatus, and thereby frequency drift occurs.

SUMMARY OF THE INVENTION

Therefore, an object of the present invention is to provide a two-point modulator and a calibration processing method which enable calibration to be performed in short time and optimally, by suppressing signal distortion due to frequency offset and frequency drift, and calibrating a gain and nonlinearity of a VCO in a state where a feedback circuit is in an open loop state.

The present invention is directed to a two-point modulator using a voltage control oscillator. In order to achieve the above object, a two-point modulator of the present invention comprises: a modulation section including a feedback circuit for performing feedback control of a signal outputted from the voltage control oscillator based on an inputted modulated signal, and a feedforward circuit for calibrating the modulated signal and outputting the calibrated modulated signal to the voltage control oscillator; a signal output section for, upon calibration processing, outputting a predetermined reference signal in place of the modulated signal, to the modulation section; and a gain correction section for, in a state where the feedback circuit is in an open loop state, calculating a frequency transition amount of the reference signal outputted from the voltage control oscillator, and correcting a gain used for calibration of the modulated signal performed by the feedforward circuit, based on the calculated frequency transition amount. The gain correction section corrects the gain so as to reflect therein influence of signal distortion due to frequency offset and frequency drift.

Typically, the reference signal has a pattern in which a positive square pulse representing a frequency f and a negative square pulse representing the frequency f are alternately generated during pulse widths T, respectively, the total number of the generated positive square pulses and negative square pulses being odd. Alternatively, the reference signal has a pattern in which a pulse with a pulse value of 0 having no frequency information, and two or more positive square pulses representing a frequency for two or more negative square pulses representing the frequency f, are generated during pulse widths T, respectively. Still alternatively, the reference signal has a pattern in which, at least, a pulse with a pulse value of 0 having no frequency information, a positive square pulse representing a frequency f1, a negative square pulse representing the frequency f1, a positive square pulse representing a frequency f2 different from the frequency f1, and a negative square pulse representing the frequency f2, are generated during pulse widths T, respectively. In this case, it is preferable that the frequency f2 is set to a maximum frequency within a range of frequency that the modulated signal can have, and the frequency f1 is set to a frequency, within the range of frequency that the modulated signal can have, corresponding to a minimum frequency transition amount which can be detected by the feedback circuit.

Moreover, if the two-point modulator further comprising the voltage holding section for holding a lockup used for the voltage control oscillator in a state where the feedback circuit is in a closed loop state, the modulation section can bring the feedback circuit into an open loop state by fixing an output voltage for the voltage control oscillator at the lockup voltage.

Moreover, it is desirable that the gain correction section calculates a frequency transition amount for each of the square pulses included in the reference signal. Particularly, it is desirable that the gain correction section calculates the frequency transition amount after the square pulses to rise and for an output of the voltage control oscillator is stabilized.

Moreover, a calibration processing method performed by a two-point modulator using a voltage control oscillator is realized by the steps of: locking up a feedback circuit for performing feedback control of a signal outputted from the voltage control oscillator based on an inputted modulated signal; applying a voltage used when the lockup is performed, to the voltage control oscillator, and thereby bringing the feedback circuit into an open loop state; outputting a predetermined reference signal to the voltage control oscillator via a feedforward circuit for calibrating the modulated signal; and calculating a frequency transition amount of the reference signal outputted from the voltage control oscillator, and correcting a gain used for calibration of the modulated signal performed by the feedforward circuit, based on the calculated frequency transition amount.

According to the present invention, distortion of the reference signal due to frequency offset and frequency drift is reflected in the correction gain value of the VCO. Therefore, calibration of the gain and nonlinearity of the VCO can be performed in short time and appropriately.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 shows an example of a table which a correction gain holding section 32 has in the first embodiment;

FIG. 12 shows an example of a table which a correction gain holding section 32 has in the third embodiment;

DESCRIPTION OF THE PREFERRED EMBODIMENTS

Configuration of Modulator of the Present Invention

Figure 1:
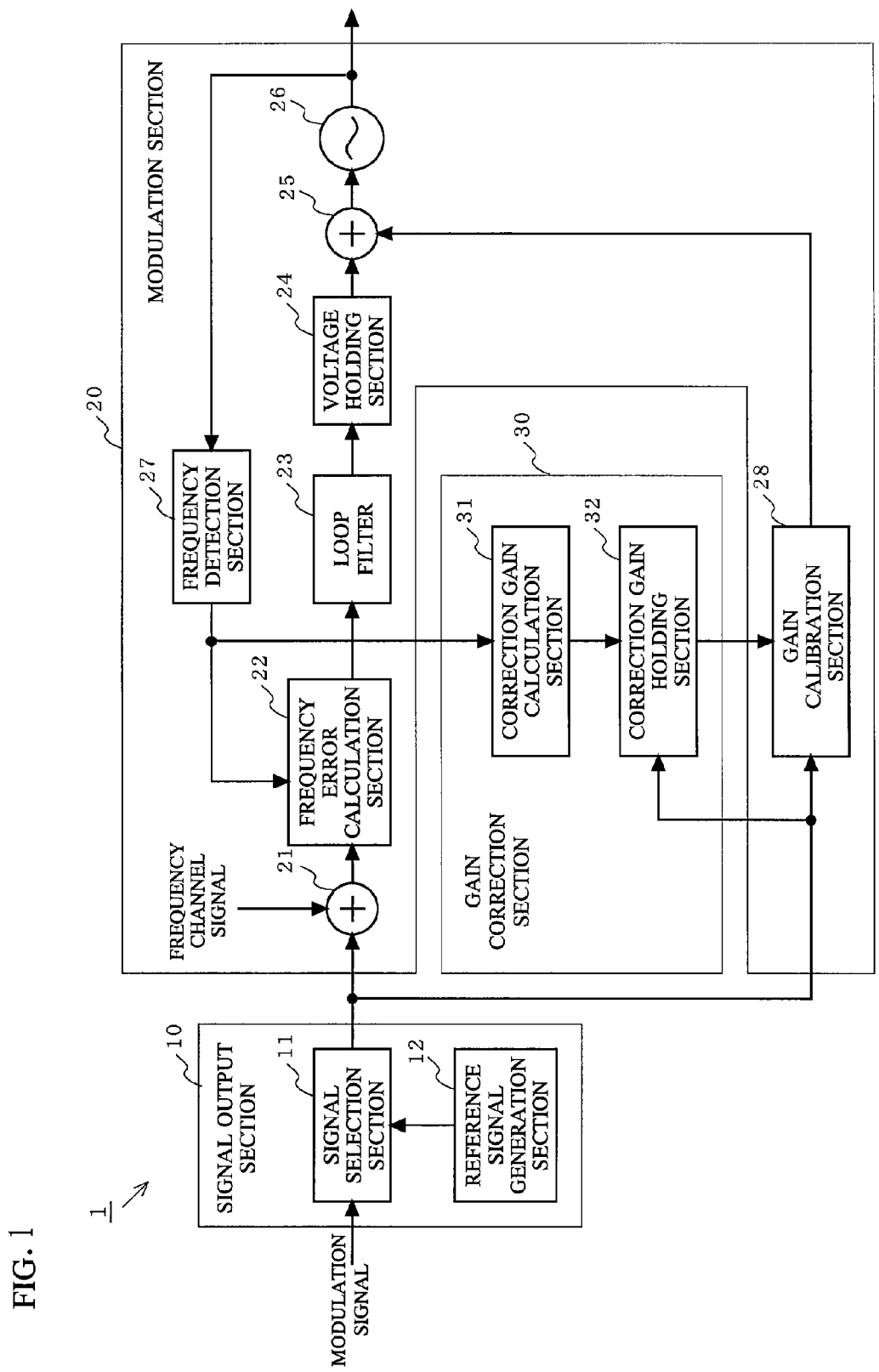
FIG. 1 shows an example of a configuration of a two-point modulator 1 according to one embodiment of the present invention.

FIG. 1 shows an example of a configuration of a two-point modulator 1 according to one embodiment of the present invention. The two-point modulator 1 includes a signal output section 10, a modulation section 20, and a gain correction section 30. The signal output section 10 includes a signal selection section 11 and a reference signal generation section 12. The modulation section 20 includes a operation section 21, frequency error calculation section 22, loop filter 23, voltage holding section 24, a adding section 25, a VCO 26, a frequency detection section 27, and a gain calibration section 28. The gain correction section 30 includes a correction gain calculation section 31 and a correction gain holding section 32.

First, an outline of the components of the two-point modulator 1 will be described.

The reference signal generation section 12 generates a reference signal used for a calibration operation described later. A modulated signal and the reference signal are inputted to the signal selection section 11. The signal selection section 11 selects and outputs a modulated signal when normal modulation processing is performed, and selects and outputs the reference signal when calibration processing is performed. For the signal selection section 11, a multiplexer or the like is used. A signal outputted from the signal selection section 11 is inputted to the operation section 21 and the gain calibration section 28 of the modulation section 20.

The signal outputted from the signal selection section 11 and a desired frequency channel signal are inputted to the operation section 21. The operation section 21 controls the center frequency of the signal outputted from the signal selection section 11 into the desired value. A signal outputted from the operation section 21 is compared with a frequency signal detected by the frequency detection section 27 in the frequency error calculation section 22, and thereby an error signal indicating a frequency error between the two signals is calculated. A high-frequency component of the error signal is suppressed by a loop filter 23, and then the error signal is outputted via the voltage holding section 24 to the adding section 25. For the loop filter 23, a low-pass filter or the like is used. The voltage holding section 24 holds the signal outputted from the loop filter 23 as needed. The VCO 26 outputs a signal having a frequency that is based on a signal (control voltage) outputted from the adding section 25. The frequency detection section 27 detects the frequency of the signal outputted from the VCO 26, and outputs the detected frequency to the error calculation section 22. For the frequency detection section 27, a frequency digital converter (FDC) or the like is used.

A feedback circuit having low-pass response is formed by the frequency error calculation section 22, the loop filter 23, the voltage holding section 24, the adding section 25, the VCO 26, and the frequency detection section 27. Owing to the feedback circuit, the error signal calculated by the frequency error calculation section 22 eventually becomes a value substantially equal to 0, and a control voltage is stabilized. The VCO 26 outputs a signal having a frequency corresponding to the desired channel signal, and is locked up.

The signal outputted from the signal selection section 11 is inputted to the gain calibration section 28. The gain calibration section 28 calibrates a gain of the signal outputted from the signal selection section 11, in accordance with a correction gain value held in the correction gain holding section 32. The adding section 25 adds a signal outputted from the gain calibration section 28 to a signal outputted from the voltage holding section 24, and outputs a signal obtained by the addition to the VCO 26. A feedforward circuit having high-pass response is formed by the gain calibration section 28, the adding section 25, and the VCO 26.

On the other hand, the correction gain calculation section 31 calculates a correction gain of the VCO 26 from the frequency detected by the frequency detection section 27, when a calibration operation is performed. The correction gain holding section 32 holds the correction gain calculated by the correction gain calculation section 31 for each frequency used in the calibration operation. The gain calibration section 28 calibrates a modulated signal passing through the feedforward circuit by using the correction gain held in the correction gain holding section 32, upon modulation processing.

Hereinafter, a characteristic calibration operation performed by the two-point modulator 1 having the above configuration will be described.

First Embodiment

Figure 2:
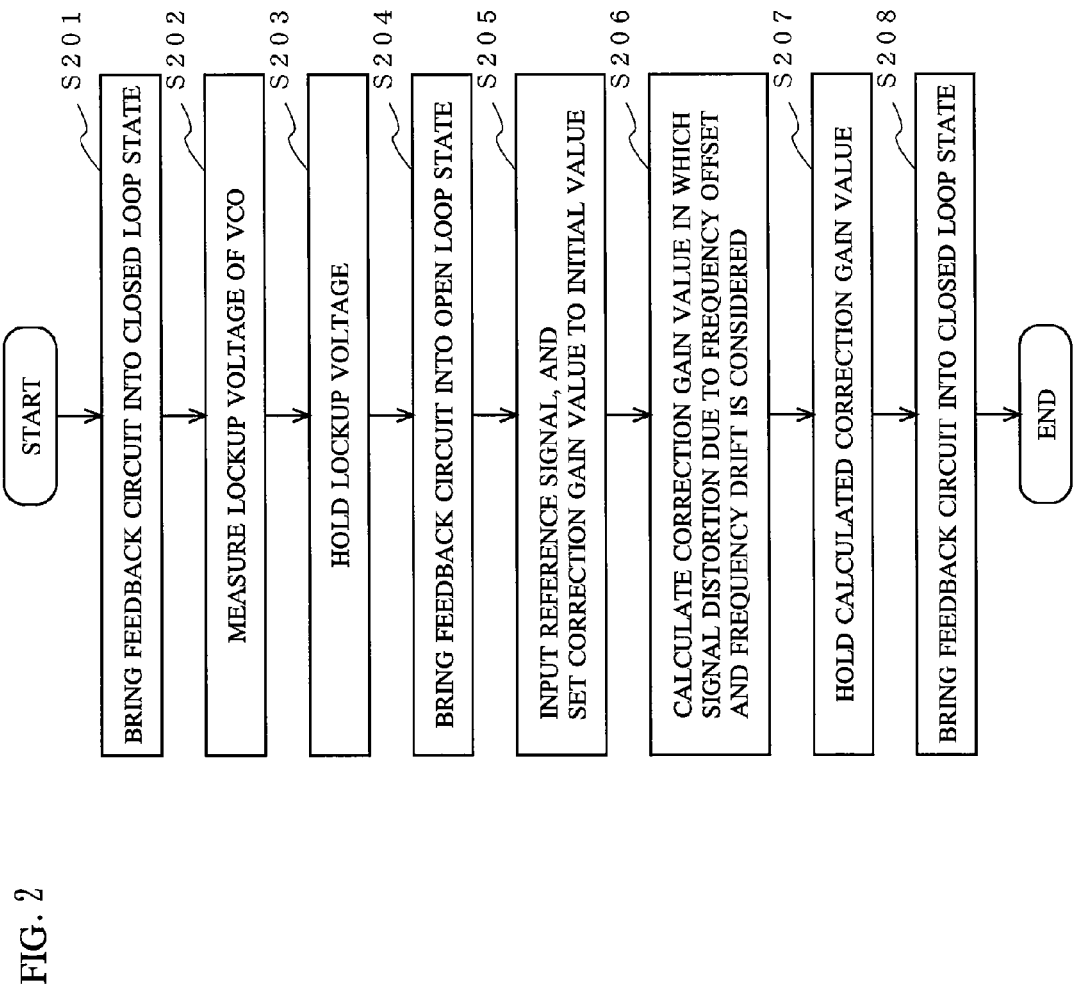
FIG. 2 is a flowchart showing a process of a calibration operation performed by the two-point modulator 1.

FIG. 2 is a flowchart showing a process of a first embodiment of a calibration operation performed by the two-point modulator 1 of the present invention.

First, signal selection section 11 selects a state where neither a modulated signal nor a reference signal is inputted thereto. A frequency channel signal of a desired frequency f is inputted to the frequency error calculation section 22, the feedback circuit is brought into a closed loop state (step S201), and then a lockup voltage, which is a voltage used when the VCO 26 is locked up in a state where a non-modulated signal is used, is measured (step S202). The lockup voltage is held in the voltage holding section 24 (step S203). Thereafter, the loop filter 23 is deactivated and the lockup voltage held by the voltage holding section 24 is fixedly supplied as a voltage to be outputted to the adding section 25, thereby bringing the feedback circuit into an open loop state (step S204).

Next, after the feedback circuit becomes an open loop state, the signal selection section 11 performs switching such that an output of the reference signal generation section 12 is selected (step S205). In addition, the gain calibration section 28 sets the correction gain value of the VCO 26 to an initial value (step S205). The reference signal generation section 12 generates a reference signal having a pulse pattern shown in FIG. 3, and outputs the reference signal to the correction gain holding section 32 and the gain calibration section 28.

Figure 3:
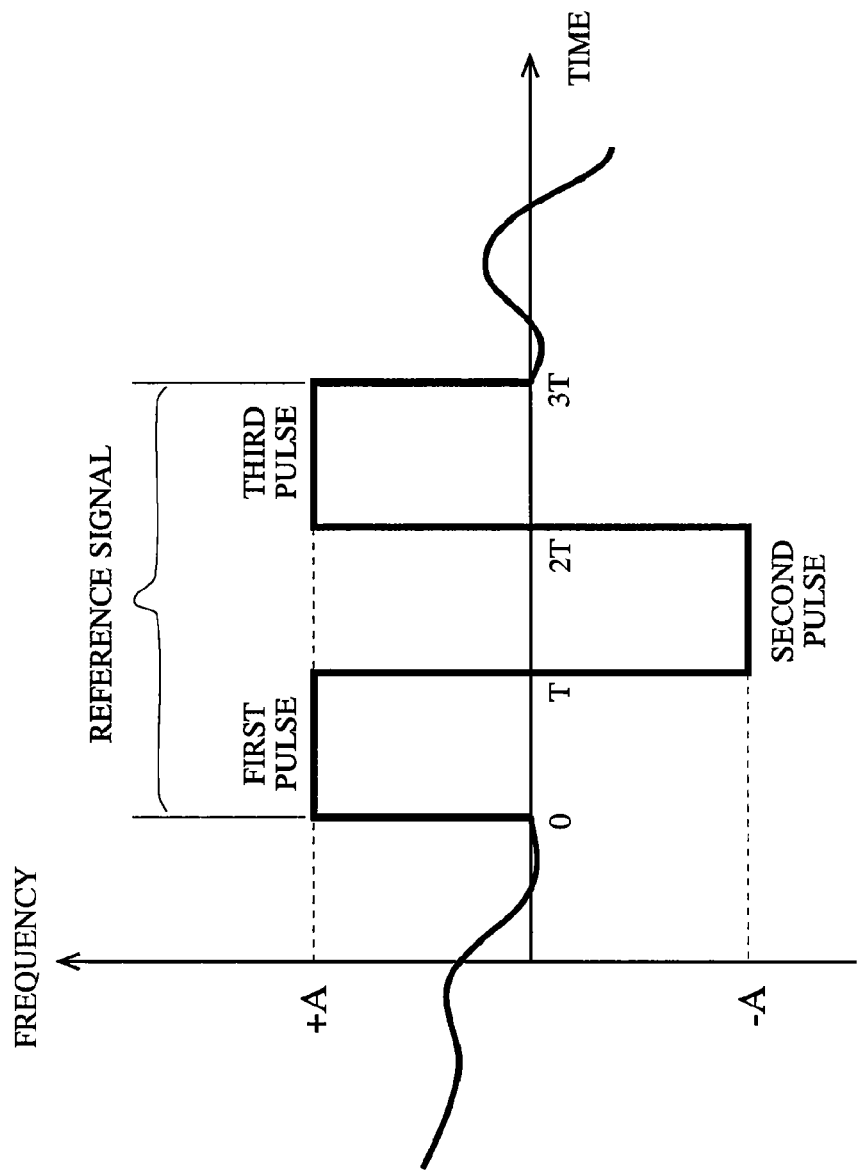
FIG. 3 shows an example of a pulse pattern of a reference signal used in a first embodiment.

FIG. 3 is a diagram for explaining the reference signal used in the first embodiment for measuring the correction gain value of the VCO 26. The reference signal shown in FIG. 3 includes a first pulse having a positive pulse value +A which represents the frequency f, a second pulse having a negative pulse value −A which represents the frequency f, and a third pulse having the positive pulse value +A. The pulse width of each of the first to third pulses is a time period T. The pulse value A and the pulse width T of the reference signal are set to values which allow the correction gain calculation section 31 to calculate a correction gain with sufficient accuracy. For example, if the pulse value A is exceedingly small, a transition amount of an output frequency of the VCO 26 is smaller than a resolution of the frequency detection section 27. Therefore, the correction gain calculation section 31 cannot precisely calculate the correction gain. On the other hand, if the pulse value A is exceedingly large, the correction gain calculation section 31 cannot precisely calculate the correction gain due to nonlinearity of the VCO 26. Moreover, if the pulse width T is exceedingly small, the correction gain calculation section 31 cannot sufficiently average an output signal of the frequency detection section 27, and is influenced by noise. Therefore the correction gain calculation section 31 cannot precisely calculate the correction gain. On the other hand, if the pulse width T is exceedingly large, it takes extra time for the correction gain calculation section 31 to calculate the correction gain.

Figure 4:
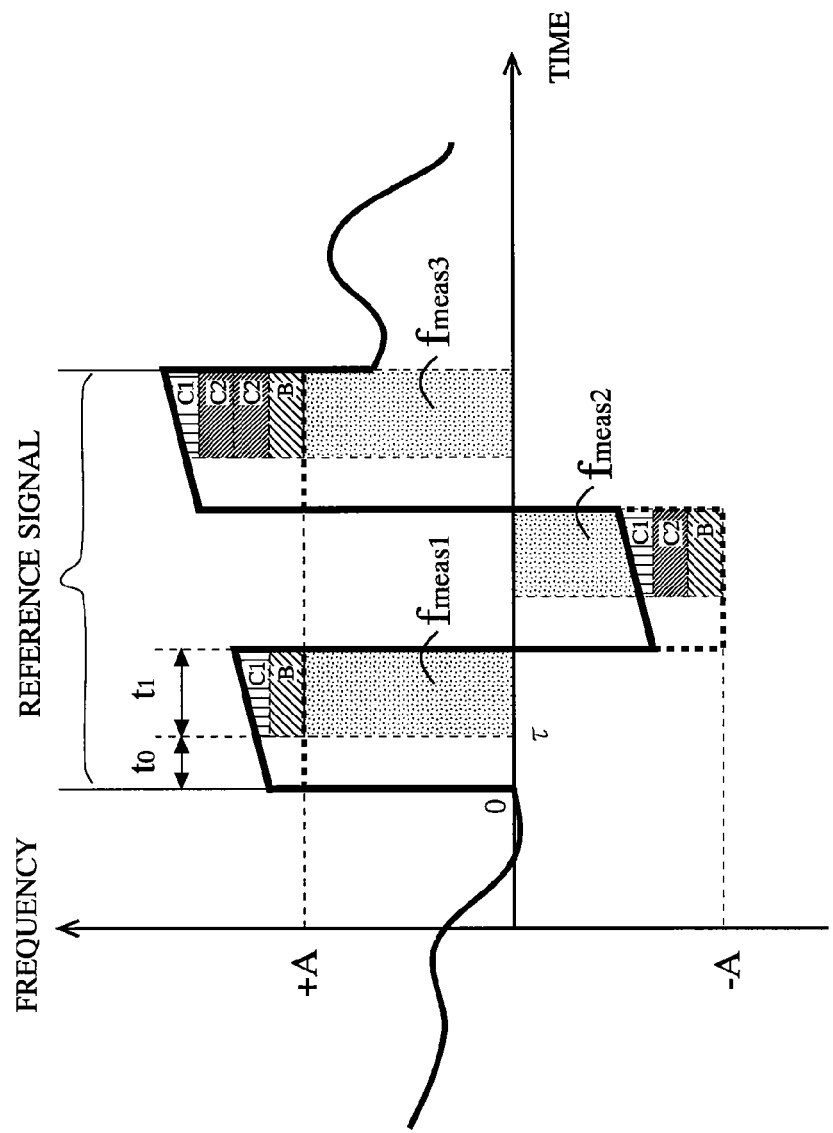
FIG. 4 is a diagram for explaining an example of a distortion occurring in the pulse pattern in FIG. 3 due to frequency offset and frequency drift.
Figure 5:
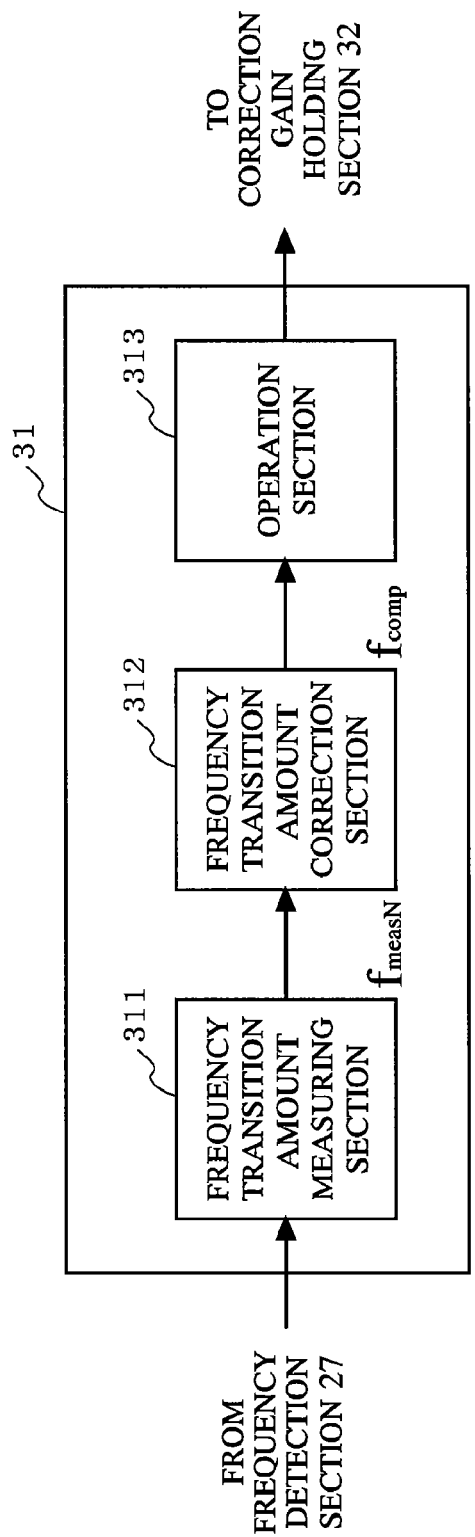
FIG. 5 shows in detail an example of a configuration of the correction gain calculation section 31 used in the first embodiment.

If the two-point modulator 1 is ideal, the reference signal shown in FIG. 3 is inputted to the VCO 26 without changing, and observed in the frequency detection section 27. However, in reality, frequency offset and frequency drift can occur. As a result, each of the pulse values ±A of the first to third pulses of the reference signal observed in the frequency detection section 27 varies by a frequency offset B, a frequency drift C1, and/or a frequency offset C2 that is due to the frequency drift as shown by a solid line in FIG. 4. Considering the above, in the first embodiment, the correction gain calculation section 31 performs calculation in accordance with the following manner (step S206). FIG. 5 shows in detail an example of a configuration of the correction gain calculation section 31.

A frequency transition amount measuring section 311 measures frequency of each of the first to third pulses in the period between when a predetermined time period t0 passes from the rising point of pulse, and when a time period t1 passes since the predetermined time period t0 passes, i.e., to the falling point of pulse, thereby obtaining an average frequency transition amount of each pulse. Note that the predetermined time period t0 is a time period which is needed for the output of the VCO 26 to follow a change of pulse and stabilize, and the length thereof can be set arbitrarily.

The obtained frequency transition amounts $f_{meas1}$ to $f_{meas3}$ of the first to third pulses are represented by the following equations, respectively.

$$f_{meas1} = +A+B+C1 \quad [1]$$

$$f_{meas2} = -A+B+C1+C2 \quad [2]$$

$$f_{meas3} = +A+B+C1+2 \cdot C2 \quad [3]$$

The frequency transition amount correction section 312 obtains a frequency transition amount $f_{comp}$ of the reference signal distorted due to the frequency offset and the frequency drift, from the frequency transition amounts $f_{meas1}$ to $f_{meas3}$ of the first to third pulses measured by the frequency transition amount measuring section 311, by using an equation [4].

$$f_{comp} = \frac{f_{meas1} - 2 \cdot f_{meas2} + f_{meas3}}{4} \quad [4]$$

A calculation result of the equation [4] is $f_{comp}=A$. Therefore, by reflecting the obtained frequency transition amount $f_{comp}$ in the reference signal, a signal distortion (B, C1, and C2) due to the frequency offset and the frequency drift can be canceled.

Accordingly, based on a frequency transition amount $f_{ref}$ of the reference signal outputted from the reference signal generation section 12 and the frequency transition amount $f_{comp}$, the operation section 313 obtains, by using the following equation [5], a correction gain value G for calibrating a gain of the VCO 26, in which the signal distortion due to the frequency offset and the frequency drift is considered.

$$G = \frac{f_{ref}}{|f_{comp}|} \quad [5]$$

The obtained correction gain value G of the VCO 26 is held in the correction gain holding section 32 (step S207). Note that, in the case where a plurality of frequencies (fa, fb, . . . ) are used for the channel signal in the two-point modulator 1, the correction gain value G of the VCO 26 is obtained for each of the plurality of channel frequencies. FIG. 6 is an example of a table which the correction gain holding section 32 of the first embodiment has. In the table, the correction gain values G may be held for the plurality of channel frequencies, respectively, as shown in FIG. 6, or one correction gain value G may be held and calibrated every time the VCO is locked to each channel frequency. In the latter case, a circuit scale can be reduced in comparison with the former case. Alternatively, since it takes long time for variation such as temperature change or secular change to be caused in comparison with the time during which the communication system performs a communication, the correction gain value G may not necessarily be calibrated every time the VCO is locked to each channel frequency, and may be calibrated at regular time intervals. Thus, lockup time in the case where calibration is not performed can be reduced, and power consumption can be reduced.

The calibration processing is completed as described above. The signal selection section 11 switches the system to a state where the modulated signal is selected, and the feedback circuit changes the output of the voltage holding section 24 to an output from the loop filter 23, thereby returning to a closed loop state (step S208). In modulation processing, the correction gain holding section 32 determines a frequency of the modulated signal, and the correction gain value G of the VCO 26 corresponding to the determined frequency is outputted to the gain calibration section 28.

As described above, according to the first embodiment, an average value of frequency transition amount of each pulse included in the reference signal is reflected in the correction gain value. Thus, even if distortion due to frequency offset and frequency drift occurs on the reference signal, calibration of a gain of the VCO 26 can appropriately be performed. Moreover, since the calibration is performed with the feedback circuit being in an open loop state, the calibration is completed in a short time in comparison with conventional art.

In the first embodiment, there is described the reference signal including the first pulse having the pulse value +A, the second pulse having the pulse value −A, and the third pulse having the pulse value +A each of which is generated during the time period T. However, the reference signal is not limited to the pulse pattern described in the first embodiment. The order or the number of pulses can freely be set as long as using a pulse pattern in which a pulse having the pulse value +A and a pulse having the pulse value −A are alternately generated during the pulse widths T, respectively, and the total number of the pulses is odd.

Second Embodiment

A process of a second embodiment of a calibration operation performed by the two-point modulator 1 of the present invention is basically similar to the process shown in FIG. 2, except the processing of step S206. Hereinafter, the second embodiment will be described focusing on the processing of step S206.

Figure 7:
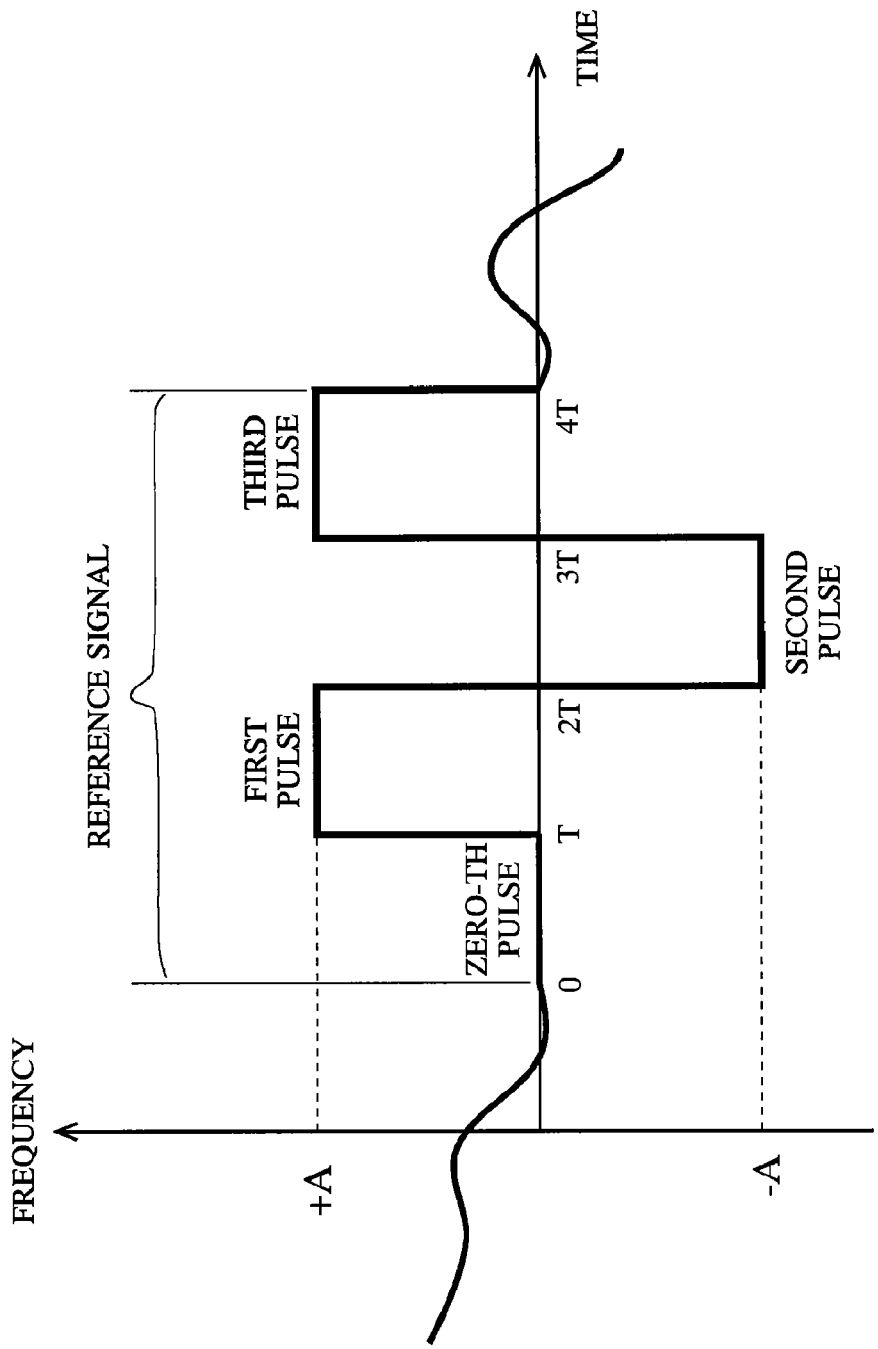
FIG. 7 shows an example of a pulse pattern of a reference signal used in a second embodiment.

When the gain calibration section 28 sets the correction gain value to an initial value (step S205), the reference signal generation section 12 generates a reference signal having a pulse pattern shown in FIG. 7, and outputs the generated reference signal to the correction gain holding section 32 and the gain calibration section 28. FIG. 7 is a diagram for explaining the reference signal used in the second embodiment for measuring the correction gain value of the VCO 26.

The reference signal shown in FIG. 7 includes a zero-th pulse which is a null signal representing no frequency information, a first pulse having a positive pulse value +A which represents a frequency f, a second pulse having a negative pulse value −A which represents the frequency f, and a third pulse having the positive pulse value +A. The pulse width of each of the zero-th to third pulses is a time period T.

Figure 8:
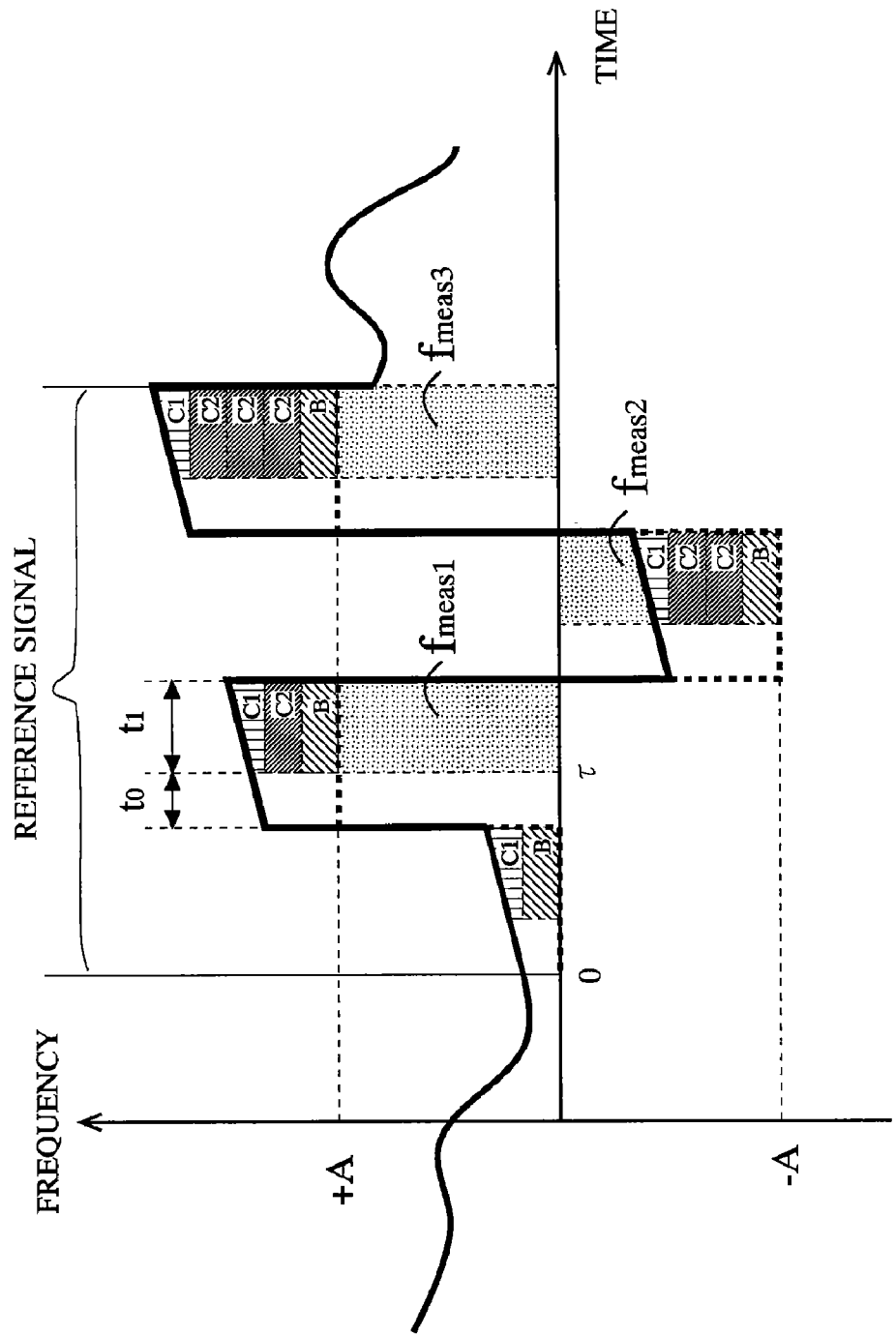
FIG. 8 is a diagram for explaining an example of a distortion occurring in the pulse pattern in FIG. 7 due to frequency offset and frequency drift.
Figure 9:
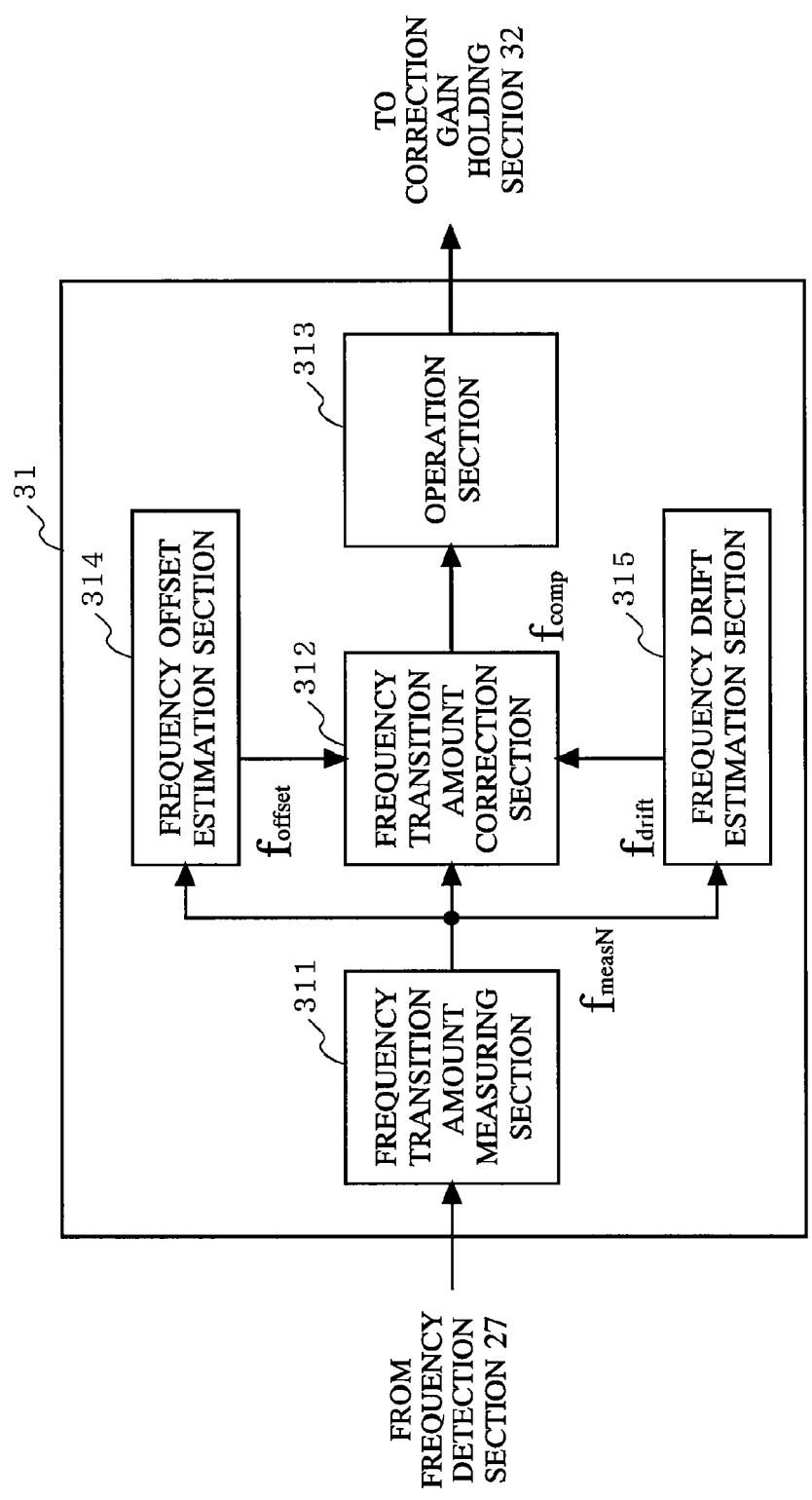
FIG. 9 shows in detail an example of a configuration of the correction gain calculation section 31 used in the second embodiment.

As described above, since frequency offset and frequency drift occur, each of the pulse values ±A of the zero-th to third pulses of the reference signal observed in the frequency detection section 27 varies by a frequency offset B, a frequency drift C1, and/or a frequency offset C2 that is due to the frequency drift as shown by a solid line in FIG. 8. Considering the above, in the second embodiment, the correction gain calculation section 31 performs calculation in accordance with the following manner (step S206). FIG. 9 shows in detail an example of a configuration of the correction gain calculation section 31.

Frequency transition amounts $f_{meas0}$ to $f_{meas3}$ of the zero-th to third pulses obtained by the frequency transition amount measuring section 311 are represented by the following equations [6] to [9], respectively.

$$f_{meas0} = +B+C1 \qquad [6]$$

$$f_{meas1} = +A+B+C1+C2 \qquad [7]$$

$$f_{meas2} = -A+B+C1+2 \cdot C2 \qquad [8]$$

$$f_{meas3} = +A+B+C1+3 \cdot C2 \qquad [9]$$

A frequency offset estimation section 314 and a frequency drift estimation section 315 obtain an estimated frequency drift amount $f_{drift}$ ($\approx$C2), from the frequency transition amount $f_{meas1}$ of the first pulse and the frequency transition amount $f_{meas3}$ of the third pulse, by using an equation [10], and in addition, obtain an estimated frequency offset amount $f_{offset}$ ($\approx$B+C1), from the estimated frequency transition amount $f_{meas0}$ of the zero-th pulse, by using the following equation [11]. Although C1 is in fact an error due to frequency drift, C1 can be treated in the same manner as in an error due to frequency offset B since C1 is included in all the equations [6] to [9]. Accordingly, +B+C1 is treated as the estimated frequency offset amount $f_{offset}$, in the present invention.

$$f_{drift} = \frac{f_{meas3} - f_{meas1}}{2} \qquad [10]$$

$$f_{offset} = f_{meas0} \qquad [11]$$

The frequency transition amount correction section 312 obtains a frequency transition amount $f_{comp}$ of each pulse of the reference signal, from the estimated frequency offset amount $f_{offset}$ and the estimated frequency drift amount $f_{drift}$, by using the following equation [12].

$$f_{comp} = f_{measN} - f_{offset} - N \cdot f_{drift} \; (N=1 \text{ to } 3) \qquad [12]$$

Moreover, based on a frequency transition amount $f_{ref}$ of the reference signal outputted from the reference signal generation section 12 and each frequency transition amount $f_{comp}$, the operation section 313 obtains a correction gain value G, for each frequency, for calibrating a gain of the VCO 26, by using the following equation [13].

$$G_N = \frac{f_{refN}}{|f_{compN}|} \; (n=1 \text{ to } 3) \qquad [13]$$

As described above, according to the second embodiment, the estimated frequency offset and estimated frequency drift are obtained and reflected in the correction gain value. Thus, even if distortion due to frequency offset and frequency drift occurs on the reference signal, calibration of a gain of the VCO 26 can appropriately be performed.

In the second embodiment, there is described the reference signal including the zero-th pulse having a pulse value of 0, the first pulse having the pulse value +A, the second pulse having the pulse value –A, and the third pulse having the pulse value +A each of which is generated during the time period T. However, the reference signal is not limited to the pulse pattern described in the second embodiment. The order or the number of pulses can freely be set as long as using a pulse pattern in which a pulse having a pulse value of 0 and at least two pulses having the same pulse value (+A or –A) are generated.

Third Embodiment

A process of a third embodiment of a calibration operation performed by the two-point modulator 1 of the present invention is basically similar to the process shown in FIG. 2, except the processing of step S206. Hereinafter, the third embodiment will be described focusing on the processing of step S206.

Figure 10:
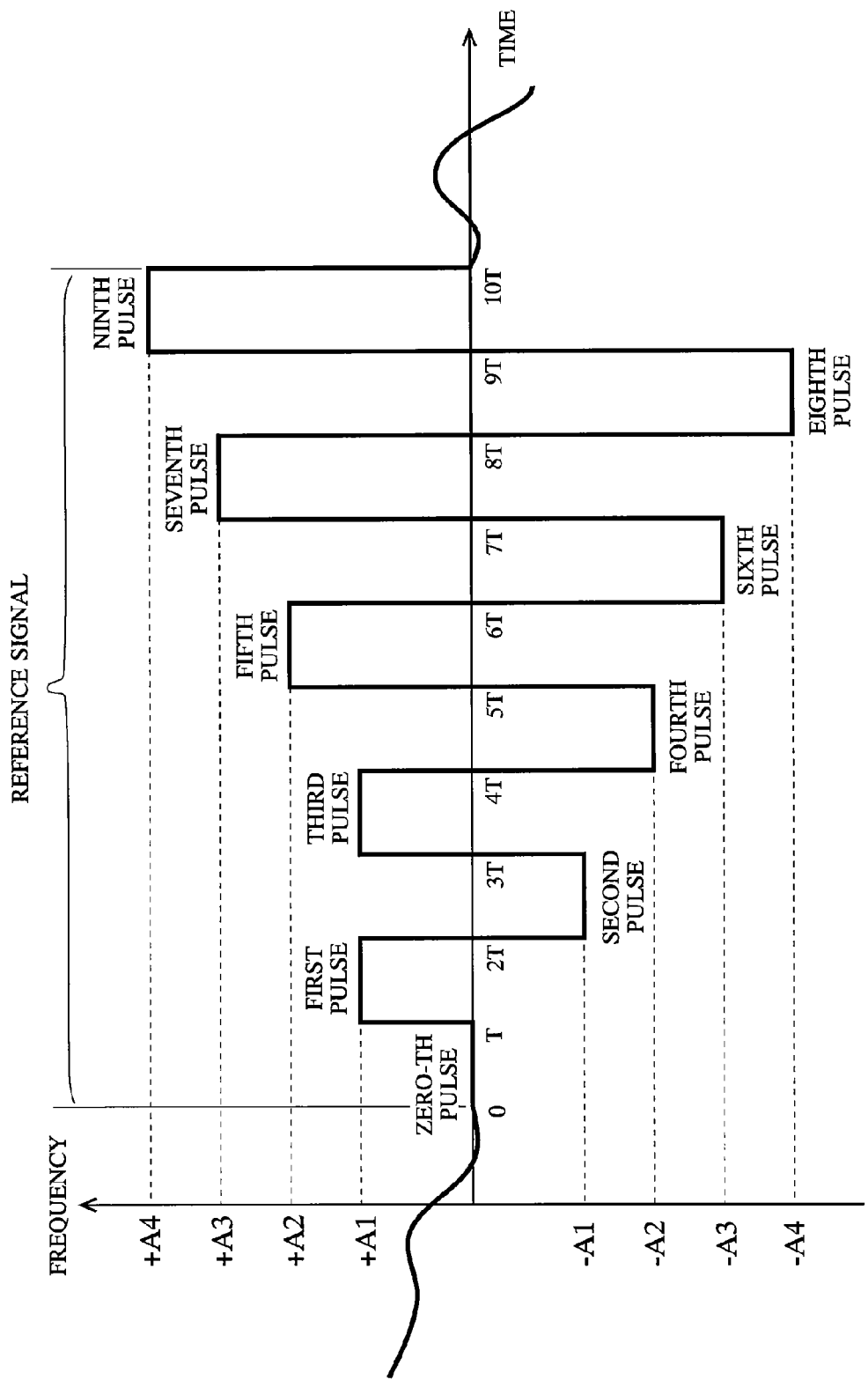
FIG. 10 shows an example of a pulse pattern of a reference signal used in a third embodiment.

When the gain calibration section 28 sets the correction gain value to an initial value (step S205), the reference signal generation section 12 generates a reference signal having a pulse pattern shown in FIG. 10, and outputs the generated reference signal to the correction gain holding section 32 and the gain calibration section 28. FIG. 10 is a diagram for explaining the reference signal used in the third embodiment for measuring the correction gain value of the VCO 26.

The reference signal shown in FIG. 10 includes a zero-th pulse which is a null signal representing no frequency information, a first pulse having a positive pulse value +A1 which represents a frequency f1, a second pulse having a negative pulse value –A1 which represents the frequency f1, a third pulse having the positive pulse value +A1, a fourth pulse having a negative pulse value –A2 which represents a frequency f2, a fifth pulse having a positive pulse value +A2 which represents the frequency f2, a sixth pulse having the negative pulse value –A3 which represents a frequency f3, a seventh pulse having a positive pulse value +A3 which represents the frequency f3, an eighth pulse having a negative pulse value –A4 which represents a frequency f4, and a ninth pulse having a positive pulse value +A4 which represents a frequency f4. The pulse width of each of the zero-th to ninth pulses is a time period T.

Figure 11:
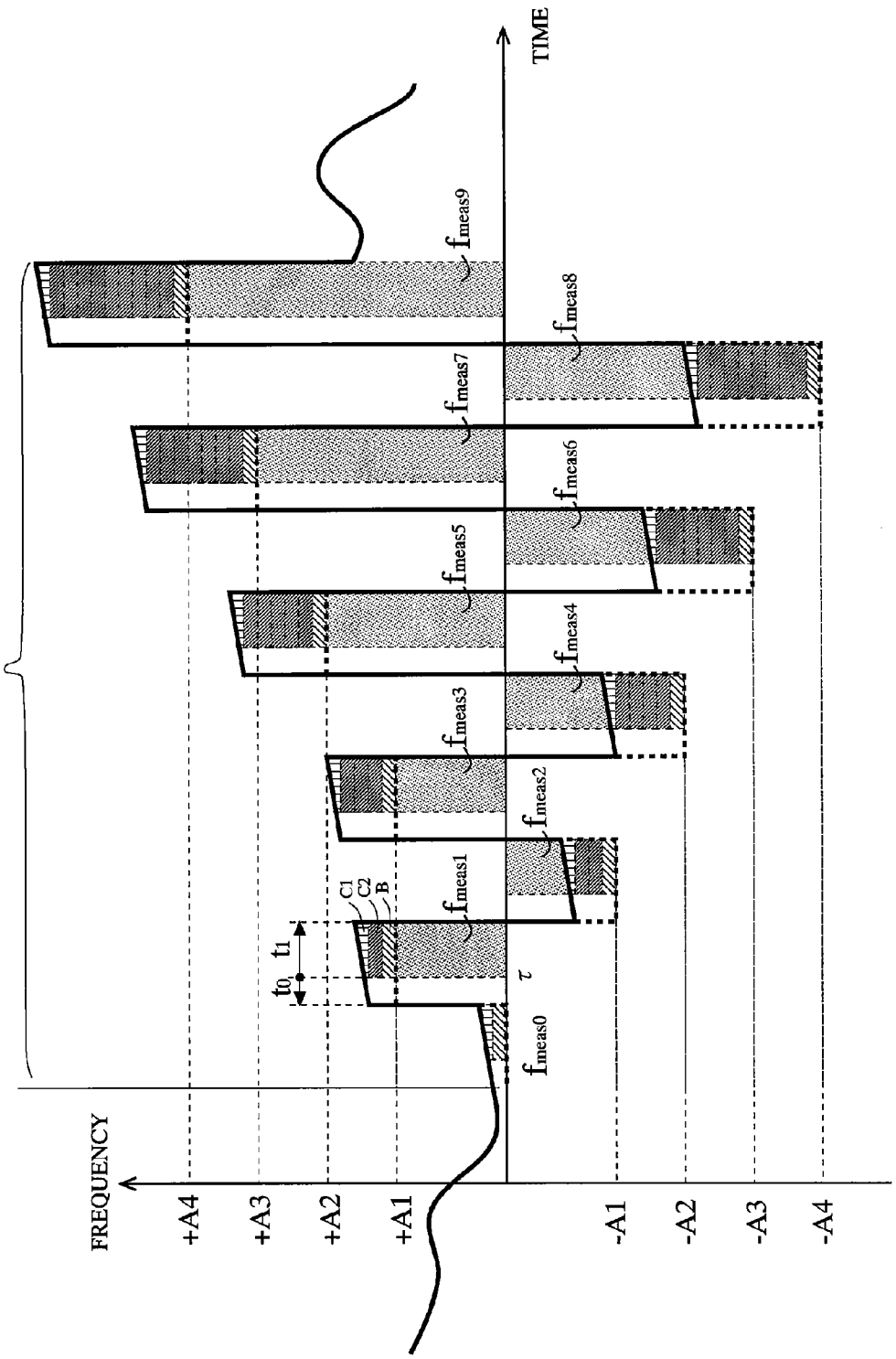
FIG. 11 is a diagram for explaining an example of a distortion occurring in the pulse pattern in FIG. 10 due to frequency offset and frequency drift.
Figure 13:
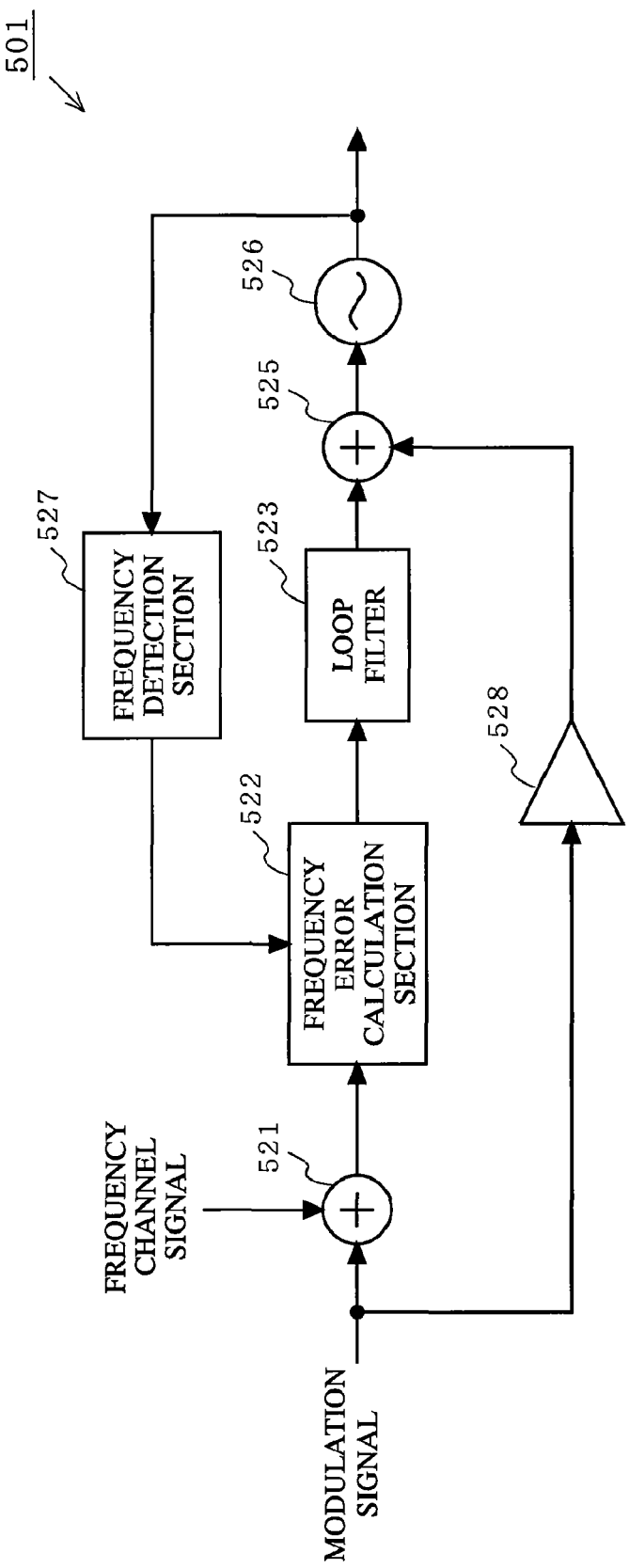
FIG. 13 shows an example of a configuration of a conventional two-point modulator 501.
Figure 14:
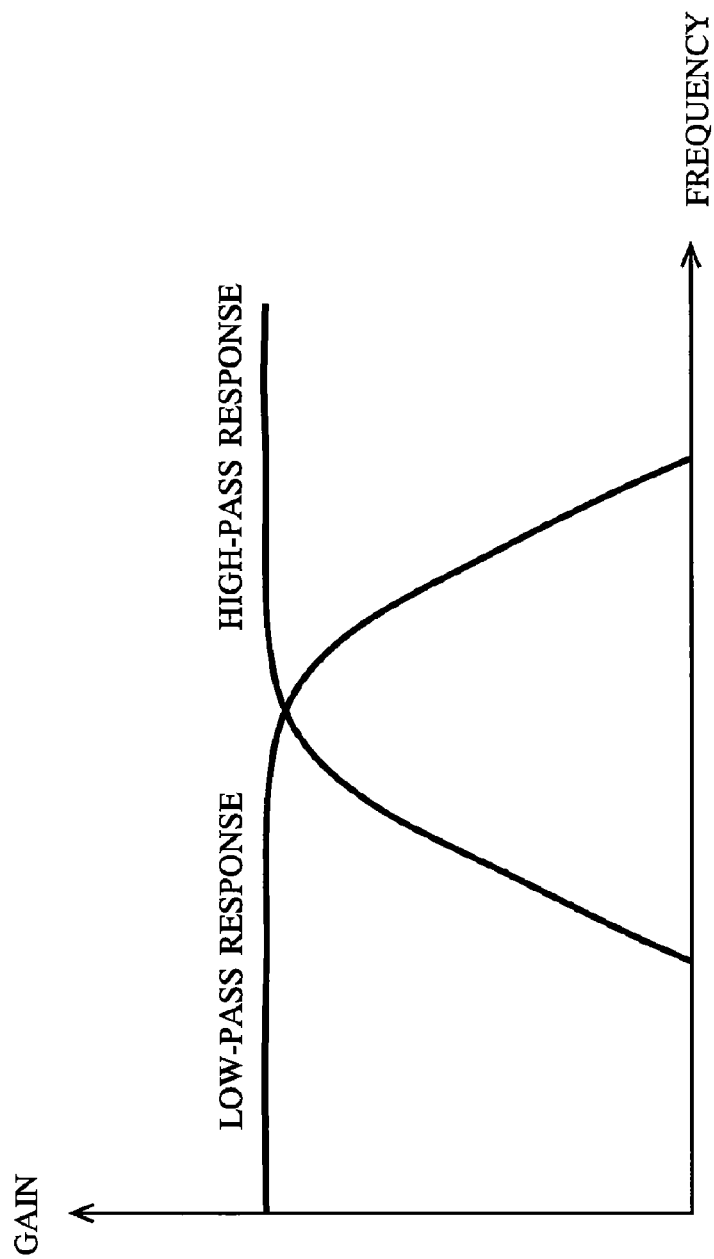
FIG. 14 shows how a modulator having a wide band can be realized with use of a two-point modulation method.

As described above, since frequency offset and frequency drift occur, the pulse values ±A of the zero-th to ninth pulses of the reference signal observed in the frequency detection section 27 each vary by a frequency offset B, a frequency drift C1, and/or a frequency offset C2 that is due to the frequency drift as shown by a solid line in FIG. 11. Considering the above, in the third embodiment, the correction gain calculation section 31 performs calculation in accordance with the following manner (step S206). An example of a detailed configuration of the correction gain calculation section 31 is the same as in FIG. 9.

Frequency transition amounts $f_{meas0}$ to $f_{meas9}$ of the zero-th to ninth pulses obtained by the frequency transition amount measuring section 311 are represented by the following equations [14] to [23], respectively.

$$f_{meas0} = +B+C1 \qquad [14]$$

$$f_{meas1} = +A1+B+C1+C2 \qquad [15]$$

$$f_{meas2} = -A1+B+C1+2 \cdot C2 \qquad [16]$$

$$f_{meas3} = +A1+B+C1+3 \cdot C2 \qquad [17]$$

$$f_{meas4} = -A2+B+C1+4 \cdot C2 \qquad [18]$$

$$f_{meas5} = +A2+B+C1+5 \cdot C2 \qquad [19]$$

$$f_{meas6} = -A3+B+C1+6 \cdot C2 \qquad [20]$$

$$f_{meas7} = +A3+B+C1+7 \cdot C2 \qquad [21]$$

$$f_{meas8} = -A4+B+C1+8 \cdot C2 \qquad [22]$$

$$f_{meas9} = +A4+B+C1+9 \cdot C2 \qquad [23]$$

Moreover, a frequency offset estimation section 314 and a frequency drift estimation section 315 obtain an estimated frequency drift amount $f_{drift}$ and the estimated frequency offset amount $f_{offset}$, by using the aforementioned equations [10] and [11]. The frequency transition amount correction section 312 obtains a frequency transition amount $f_{comp}$ of each pulse of the reference signal by using the aforementioned equation [12]. The operation section 313 obtains a correction gain value G, by using the aforementioned equation [13]. FIG. 12 is an example of a table which the correction gain holding section 32 of the third embodiment has. Other than holding all the correction gain values G corresponding to the pulse values ±A1, ±A2, ±A3, and ±A4 shown in FIG. 12, an average value of the correction gain value G corresponding to the positive pulse value +A and the correction gain value G corresponding to the negative pulse value −A may be held. Upon modulation processing, a correction gain value corresponding to a modulated signal is obtained by using the table. For interpolation among the values on the table, linear interpolation is used, for example.

As described above, according to the third embodiment, the estimated frequency offset and estimated frequency drift are obtained and applied to the correction gain value. Thus, even if distortion due to frequency offset and frequency drift occurs on the reference signal, calibration of a gain and non-linearity of the VCO 26 can appropriately be performed. Moreover, since the calibration is performed with the feedback circuit being in an open loop state, the calibration is performed in a short time in comparison with conventional art even if a reference signal having a plurality of pulses is used.

In the third embodiment, the reference signal having square pulses ±A1, ±A2, ±A3, and ±A4 is used for calibrating nonlinearity of the VCO 26. However, nonlinearity of the VCO 26 can be calibrated by calculating correction gain values for at least two frequencies in a frequency band of the modulated signal (which corresponds to the range of pulse value from −A4 to +A4, in the third embodiment). In general, when a frequency spectrum of a modulated signal is observed, it is likely that a large number of components are present near DC (near a channel frequency when a frequency spectrum in the RF band is observed). Therefore, only by calculating correction gain values for frequencies (in the third embodiment, the pulse values −A4 and +A4) corresponding to both ends of the bandwidth of the modulated signal, and frequencies (in the third embodiment, the pulse values ±A1) which are present therebetween, nonlinearity of the VCO26 can accurately be calibrated. In this case, the pulse values ±A1 only need to be values which allow the frequency transition amount to be equal to or larger than a minimum resolution of the frequency detection section 27. Moreover, by calculating correction gain values for other frequencies in the frequency band of the modulated signal, the nonlinearity can more accurately be calibrated.

Figure 15:
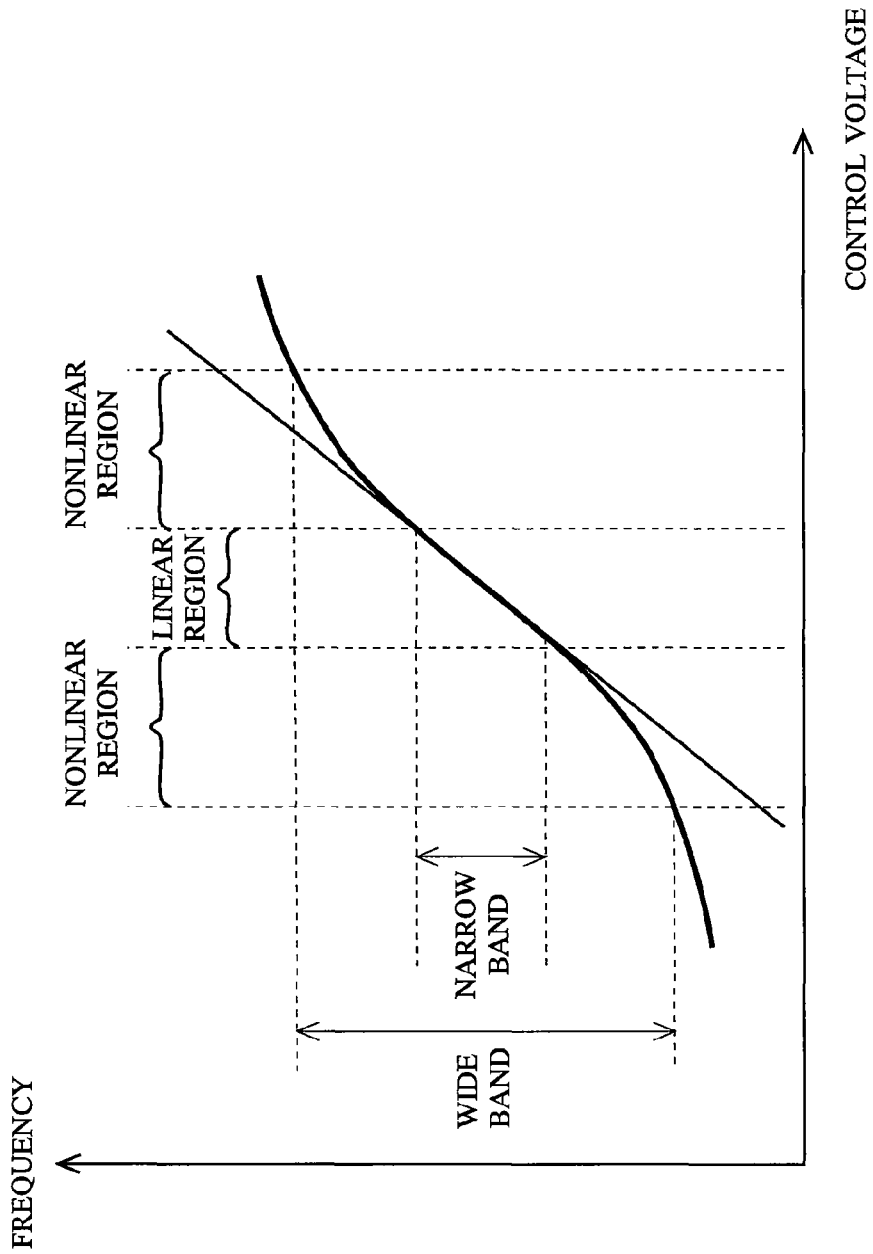
FIG. 15 shows nonlinear frequency characteristics of a VCO.
Figure 16:
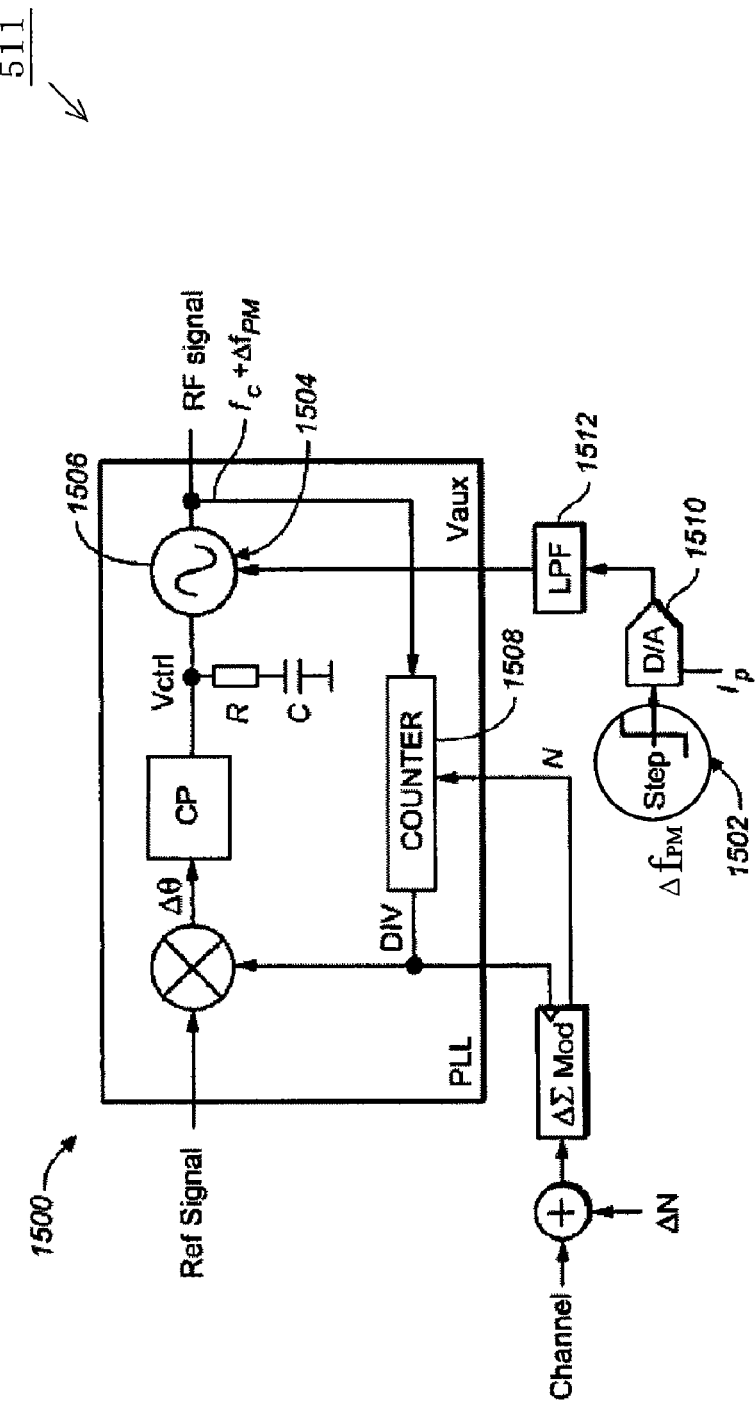
FIG. 16 shows an example of a configuration of a conventional direct modulator 511.

In the first and second embodiments, one correction gain value is obtained through calibration, and, in the third embodiment, eight correction gain values are obtained through calibration. The number of correction gain values to be obtained is determined by the bandwidth of the modulated signal and the nonlinearity of the VCO 26. In FIG. 15, if a linear region is larger than the bandwidth of the modulated signal, one correction gain value is needed. On the other hand, if a linear region is smaller than the bandwidth of the modulated signal, a plurality of correction gain values are needed.

In addition, in order to enhance accuracy of calibration, it is desirable that, as shown in FIG. 10, a plurality of pulses included in the reference signal are arranged in the order of a square pulse having the lowest frequency (pulse values ±A1) to a square pulse having the highest frequency (pulse values ±A4). The reason will be described below. As shown in FIG. 11, square pulses outputted later are more influenced by frequency drift. Therefore, if a square pulse having a low frequency is outputted later, the square pulse is more easily influenced by frequency drift than a square pulse having a high frequency. Accordingly, by outputting square pulses in ascending order of square pulse having the lowest frequency, the square pulses are not extremely influenced by frequency drift, thus enhancing accuracy of calibration.

Moreover, in the third embodiment, although the pulse width T is fixed for any reference signals, the pulse value T may be varied depending on pulse values. As previously described, a pulse width of the reference signal is determined by how much influence of noise is reduced by averaging. Considering that an S/N ratio of an average frequency transition amount measured by the correction gain calculation section 31 should be constant, the larger the pulse value of the reference signal is, relatively the smaller influence of noise becomes and therefore the shorter the pulse width can be made. For example, if a pulse width of a reference signal having pulse values ±A1 is T, a pulse width of a reference signal having a pulse value A2 (=2×A1) can be set to T/2. Thus, lockup time can be reduced.

In the third embodiment, a frequency drift amount is estimated by using the first to third pulses, and then frequency drift of other pulses is corrected by using the estimated frequency drift. However, increased number of square pulses may be outputted as a reference signal, and a frequency drift amount may be estimated for each of the square pulses having pulse values ±A1, ±A2, ±A3, and ±A4. That is, each of the square pulses having the pulse value ±A1, ±A2, ±A3, and ±A4 may be outputted two times, and a frequency drift amount may be estimated and corrected for each of the outputted square pulses. By estimating a frequency drift amount for each of the square pulses, accuracy of calibration is enhanced. However, increasing the number of pulses to be outputted as a reference signal increases time taken for calibration. Therefore, the number of pulse is determined by trade-off between lockup time and accuracy of calibration which are specified in the communication system.

Moreover, it is preferable that the zero-th pulse used for estimating frequency offset is used for a start pulse of a reference signal, since the start pulse is hardly influenced by frequency drift. Alternatively, the zero-th pulse may be positioned in mid-stream or at the end of a reference signal. In addition, the first pulse and the third pulse which are used for frequency drift may separately be generated at the beginning and end of a reference signal, or may continuously be generated.

While the invention has been described in detail, the foregoing description is in all aspects illustrative and not restrictive. It is understood that numerous other modifications and variations can be devised without departing from the scope of the invention.

What is claimed is:

1. A two-point modulator using a voltage control oscillator, the two-point modulator comprising:
   a modulation section including a feedback circuit for performing feedback control of a signal outputted from the voltage control oscillator based on an inputted modulated signal, and a feedforward circuit for calibrating the modulated signal and outputting the calibrated modulated signal to the voltage control oscillator;
   a signal output section for, upon calibration processing, outputting a predetermined reference signal in place of the modulated signal, to the modulation section; and a gain correction section for, in a state where the feedback circuit is in an open loop state, calculating a frequency transition amount of the reference signal outputted from the voltage control oscillator, and correcting a gain used for calibration of the modulated signal performed by the feedforward circuit, based on the calculated frequency transition amount.

2. The two-point modulator according to claim 1, wherein the reference signal has a pattern in which a positive square pulse representing a frequency f and a negative square pulse representing the frequency f are alternately generated during pulse widths T, respectively, the total number of the generated positive square pulses and negative square pulses being odd.

3. The two-point modulator according to claim 1, wherein the reference signal has a pattern in which a pulse with a pulse value of 0 having no frequency information, and two or more positive square pulses representing a frequency f or two or more negative square pulses representing the frequency f, are generated during pulse widths T, respectively.

4. The two-point modulator according to claim 1, wherein the reference signal has a pattern in which, at least, a pulse with a pulse value of 0 having no frequency information, a positive square pulse representing a frequency f1, a negative square pulse representing the frequency f1, a positive square pulse representing a frequency f2 different from the frequency f1, and a negative square pulse representing the frequency f2, are generated during pulse widths T, respectively.

5. The two-point modulator according to claim 4, wherein the frequency f2 is a maximum frequency within a range of frequency that the modulated signal can have, and the frequency f1 is a frequency, within the range of frequency that the modulated signal can have, corresponding to a minimum frequency transition amount which can be detected by the feedback circuit.

6. The two-point modulator according to claim 1, further comprising the voltage holding section for holding a lockup voltage used for the voltage control oscillator in a state where the feedback circuit is in a closed loop state, wherein
the modulation section fixes an output voltage for the voltage control oscillator at the lockup voltage, and thereby brings the feedback circuit into an open loop state.

7. The two-point modulator according to claim 2, wherein the gain correction section calculates a frequency transition amount for each of the square pulses included in the reference signal.

8. The two-point modulator according to claim 3, wherein the gain correction section calculates a frequency transition amount for each of the square pulses included in the reference signal.

9. The two-point modulator according to claim 4, wherein the gain correction section calculates a frequency transition amount for each of the square pulses included in the reference signal.

10. The two-point modulator according to claim 7, wherein the gain correction section calculates the frequency transition amount after the square pulses to rise and for an output of the voltage control oscillator is stabilized.

11. The two-point modulator according to claim 8, wherein the gain correction section calculates the frequency transition amount after the square pulses to rise and for an output of the voltage control oscillator is stabilized.

12. The two-point modulator according to claim 9, wherein the gain correction section calculates the frequency transition amount after the square pulses to rise and for an output of the voltage control oscillator is stabilized.

13. The two point modulator according to claim 1, wherein the gain correction section corrects the gain so as to reflect therein influence of signal distortion due to frequency offset and frequency drift.

14. A calibration processing method performed by a two-point modulator using a voltage control oscillator, the method comprising the steps of:
locking up a feedback circuit for performing feedback control of a signal outputted from the voltage control oscillator based on an inputted modulated signal;
applying a voltage used when the lockup is performed, to the voltage control oscillator, and thereby bringing the feedback circuit into an open loop state;
outputting a predetermined reference signal to the voltage control oscillator via a feedforward circuit for calibrating the modulated signal; and
calculating a frequency transition amount of the reference signal outputted from the voltage control oscillator, and correcting a gain used for calibration of the modulated signal performed by the feedforward circuit, based on the calculated frequency transition amount.

* * * * *